(12) United States Patent
Kliemannel

(10) Patent No.: US 6,759,844 B2
(45) Date of Patent: Jul. 6, 2004

(54) HALL SENSOR COMPONENT

(75) Inventor: Wolfgang Kliemannel, Lemförde (DE)

(73) Assignee: ZF Lemförder Metallwaren AG, Stemwede-Dielingen (SE)

( * ) Notice: Subject to any disclaimer, the term of this patent is extended or adjusted under 35 U.S.C. 154(b) by 0 days.

(21) Appl. No.: 10/148,145

(22) PCT Filed: Sep. 24, 2001

(86) PCT No.: PCT/DE01/03668
§ 371 (c)(1),
(2), (4) Date: May 23, 2002

(87) PCT Pub. No.: WO02/27344
PCT Pub. Date: Apr. 4, 2002

(65) Prior Publication Data
US 2002/0186010 A1 Dec. 12, 2002

(30) Foreign Application Priority Data
Sep. 26, 2000 (DE) .......................... 100 47 994

(51) Int. Cl.⁷ .............................................. G01R 33/07
(52) U.S. Cl. ....................................... 324/251; 324/537
(58) Field of Search ................................ 324/235, 251, 324/207.2, 537, 117.7, 173, 174, 263; 338/327; 327/511; 340/438, 635, 514, 516

(56) References Cited

U.S. PATENT DOCUMENTS

| | | | |
|---|---|---|---|
| 3,408,493 A | * 10/1968 | Westover et al. ........... 246/249 |
| 4,365,196 A | * 12/1982 | Finch .................... 324/207.17 |
| 4,488,112 A | * 12/1984 | Thompson et al. ......... 324/202 |
| 4,514,687 A | * 4/1985 | Van Husen ................. 324/537 |
| 4,791,311 A | 12/1988 | Vig |
| 5,218,298 A | 6/1993 | Vig |
| 5,241,270 A | 8/1993 | Ng |
| 5,343,145 A | * 8/1994 | Wellman et al. ............ 324/202 |
| 5,517,112 A | 5/1996 | Vig et al. |
| 5,844,411 A | 12/1998 | Vogt |

FOREIGN PATENT DOCUMENTS

| | | |
|---|---|---|
| DE | 195 39 458 A1 | 4/1997 |
| DE | 196 06 826 A1 | 8/1997 |
| DE | 44 25 416 C2 | 7/1998 |

* cited by examiner

Primary Examiner—N. Le
Assistant Examiner—Reena Aurora
(74) Attorney, Agent, or Firm—McGlew and Tuttle, P.C.

(57) ABSTRACT

A Hall sensor component includes an assembly unit with a Hall sensor and a processing device. The Hall sensor has an electric current input for providing a Hall sensor output signal depending on a magnetic field acting on the Hall sensor and depending on the electric current. The processing device is arranged for receiving an input signal including the Hall sensor output signal and processing the input signal to provide an output signal associated with the Hall sensor output signal. A signal generator generates a diagnosis signal. The signal generator sends the diagnosis signal to the assembly unit as one of a control signal of the electric current input, to form a Hall sensor mixed output signal dependant on said diagnosis signal, and as a mixing signal to mix with said Hall sensor output signal to form a Hall sensor mixed output signal dependant on said diagnosis signal. The Hall sensor mixed output signal is provided as the processing device input signal.

13 Claims, 4 Drawing Sheets

HALL SENSOR COMPONENT

FIELD OF THE INVENTION

The present invention pertains to a Hall sensor component with a Hall sensor through which an electric current flows and which sends a Hall signal, which depends on a magnetic field acting on the Hall sensor and the electric current, and a processing device arranged downstream of the Hall sensor for processing an input signal, which sends an output signal associated with the input signal.

BACKGROUND OF THE INVENTION

Hall sensors have been known from the prior art. They comprise, in principle, a conductive sensor surface, through which a current flows. If a magnetic field interacts with the sensor surface through which the current flows, the charged particles generated by the current are deflected on the basis of the Lorentz force, as a result of which an electric field is generated in the sensor surface, which is the cause for a voltage being present at lateral edges of the sensor surface. This voltage, which is called the Hall voltage, is proportional to the product of the magnetic flux density of the magnetic field and the current flowing through the sensor surface, so that the magnetic flux density can be determined by measuring the Hall voltage at a known current except for a proportionality factor, which depends, among other things, on the geometric dimensions of the sensor surface.

Hall sensors are available commercially, e.g., in the form of Hall sensor components, in which a processing device, which processes the Hall signal sent by the Hall sensor for an evaluation and sends a signal associated with the Hall signal as an output signal, is arranged downstream of the Hall sensor proper. Both the Hall sensor and the processing device are integrated in a single housing.

Hall sensor components are equipped with different processing devices for different possible applications. One possible application is, e.g., the determination of the magnetic flux density of the magnetic field acting on the Hall sensor by means of the Hall sensor component. The processing device is preferably designed for this purpose such that there is a linear dependence between the signal intensity of the output signal and the magnetic flux density in the broadest possible range.

Another possible application is the use of a Hall sensor component in conjunction with a magnet as a switching device subject to little friction loss, which can be switched into at least two switching states with a switch lever. A magnet, which is brought into the range of action of a Hall sensor component associated with the first switching state in a first switching state of the two switching states, is provided at the switch lever. The range of action is defined here as the area in space around the Hall sensor component, into which the magnet must be brought in order to bring about such an increase in the value of the Hall sensor that a first threshold value preset by the processing device will be exceeded. By setting this threshold value, it is thus possible to set the distance in space between the magnet and the Hall sensor provided in the Hall sensor component, below which distance the actual distance is to drop and at which the first switching state is considered to be switched on. Furthermore, a second threshold value, by which the distance in space between the magnet and the Hall sensor, which is to be exceeded and at which the first switching state is considered to be switched off, is preset by the processing device. The second threshold value may differ from the first threshold value, so that a so-called switching hysteresis is provided by the processing device. The processing device may be equipped, e.g., with a Schmitt trigger as a threshold value transducer to embody this switching hysteresis. The Hall sensor component may, of course, also be arranged at the switch lever in such low-friction switching devices. The Hall sensor component can be introduced in this case into the magnetic field of the magnet by moving the switch lever.

However, the more circuits are arranged downstream of the Hall sensor proper in the Hall sensor component, the greater is also the risk for failure of the Hall sensor component because of a defect in one of these circuits. If a prior-art Hall sensor component fails because of such a defect, the problem frequently arises that the ability of the Hall sensor component to function cannot be checked in the installed state or during operation, so that the defect is not recognized.

SUMMARY OF THE INVENTION

The basic object of the present invention is to provide a Hall sensor component in which the possibility of checking its ability to function is improved.

The Hall sensor component according to the present invention has a Hall sensor, through which an electric current flows, and a processing device for processing an input signal. The Hall sensor sends a Hall signal, which depends on a magnetic field acting on the Hall sensor and on the electric current. A processing device, which sends an output signal that is associated with and depends on the input signal, is arranged downstream of the Hall sensor. The Hall sensor and the processing device form one assembly unit, to which a diagnosis signal generated by a signal generator is sent. The Hall sensor is linked indirectly or directly with the diagnosis signal, and the Hall signal linked with the diagnosis signal is sent to the processing device as an input signal.

Since the Hall signal which is directly or indirectly linked with the diagnosis signal is sent according to the present invention to the processing device, the output signal is also affected by the diagnosis signal in a characteristic manner. However, two signal components, of which a first signal component characterizes the magnetic field and the second signal component characterizes the diagnosis signal, are thus derived according to the present invention from the output signal, the first signal component of the output signal being hereinafter called the magnetic component and the second signal component of the output signal being called the diagnosis component.

The diagnosis signal used may be any signal insofar as the diagnosis component and the magnetic component can be derived from the output signal. However, the diagnosis signal is preferably a periodic square wave signal.

The diagnosis signal can be sent to the Hall sensor in different ways. According to a first alternative, the Hall sensor may be directly linked with the diagnosis signal. The direct linking of the Hall signal and the diagnosis signal takes place only at or behind the output of the Hall sensor and may be embodied, e.g., by adding the Hall signal and the diagnosis signal by means of an analog adder to form a mixed signal, which will then form the input signal of the processing device.

However, according to a second alternative, the Hall signal may also be linked indirectly with the diagnosis signal by the electric current flowing through the Hall sensor being controlled as a function of the diagnosis signal.

If a periodic square wave signal, which alternatingly assumes a logic H (high) level and a logic L (low) level as a signal state, is sent to the Hall sensor in the case of the indirect linking of the Hall signal and the diagnosis signal, the current flowing through the Hall sensor is preferably switched on and off as a function of the signal state of the square wave signal. This means that the current is switched on when the square wave signal has a logic H level, and the current is switched off when the square wave signal has a logic L level or vice versa. The current flowing through the Hall sensor may be supplied by the signal generator.

The signal generator may be arranged outside the Hall sensor component, in which case the diagnosis signal is sent via a connection provided at the Hall sensor component. However, the signal generator is preferably integrated within the Hall sensor component.

If the processing device has a switching hysteresis with two threshold values regarding its input, and if the diagnosis signal is a periodic signal, the frequency of the diagnosis signal is preferably changed as a function of the Hall signal. In this case, the diagnosis signal linked with the Hall signal has a sufficiently high level at least once within one period to exceed a first of the threshold values and a sufficiently low level at least once to drop below, the second threshold value. The signal generator is designed now as a voltage-controlled oscillator (VCO), which changes the frequency of the diagnosis signal as a function of the value of the Hall voltage.

Furthermore, an evaluating device, by which the diagnosis component is recognized as such and evaluated, may be arranged downstream of the processing device. Based on this evaluation, it will then be recognized whether the Hall sensor component is operating correctly at least with respect to the processing device.

The Hall sensor component according to the present invention forms a diagnosable component, which is preferably used where the recognition of the failure of the sensor would be desirable for safety reasons to prevent damage to humans or equipment.

A possible field of use of the Hall sensor component according to the present invention is, e.g., the area of motor vehicle electronics, especially the shifting of gears, for which Hall sensor components are used to form a low-friction shifting device.

To recognize the current shifting state of the gearshift lever in the passenger compartment, a magnet, which enters the range of action of one of the associated Hall sensor components in a certain shift position, may be arranged, e.g., at the gearshift lever of the gear shift mechanism in such a shifting device. This Hall sensor component is preferably formed by the Hall sensor component according to the present invention, so that a failure of this component can be recognized by a control electronic unit arranged in the motor vehicle. It is thus possible to check the ability of the Hall sensor component used in the gear shift mechanism to function by means of the control electronic unit arranged in the motor vehicle. If the failure of the Hall sensor component or of one of the Hall sensor components used in the gear shift mechanism is recognized, it is possible to display this failure to the driver and/or to allow a safety program associated with the failure to run in order to prevent a possible incorrect shifting of the transmission and consequently a possible damage to the driver or the vehicle. The Hall sensor component may, of course, be arranged at the gearshift lever in this case as well. The Hall sensor component can be brought in this case into the magnetic field of the magnet by the movement of the gearshift lever.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

DESCRIPTION OF THE PREFERRED EMBODIMENTS

Figure 1:
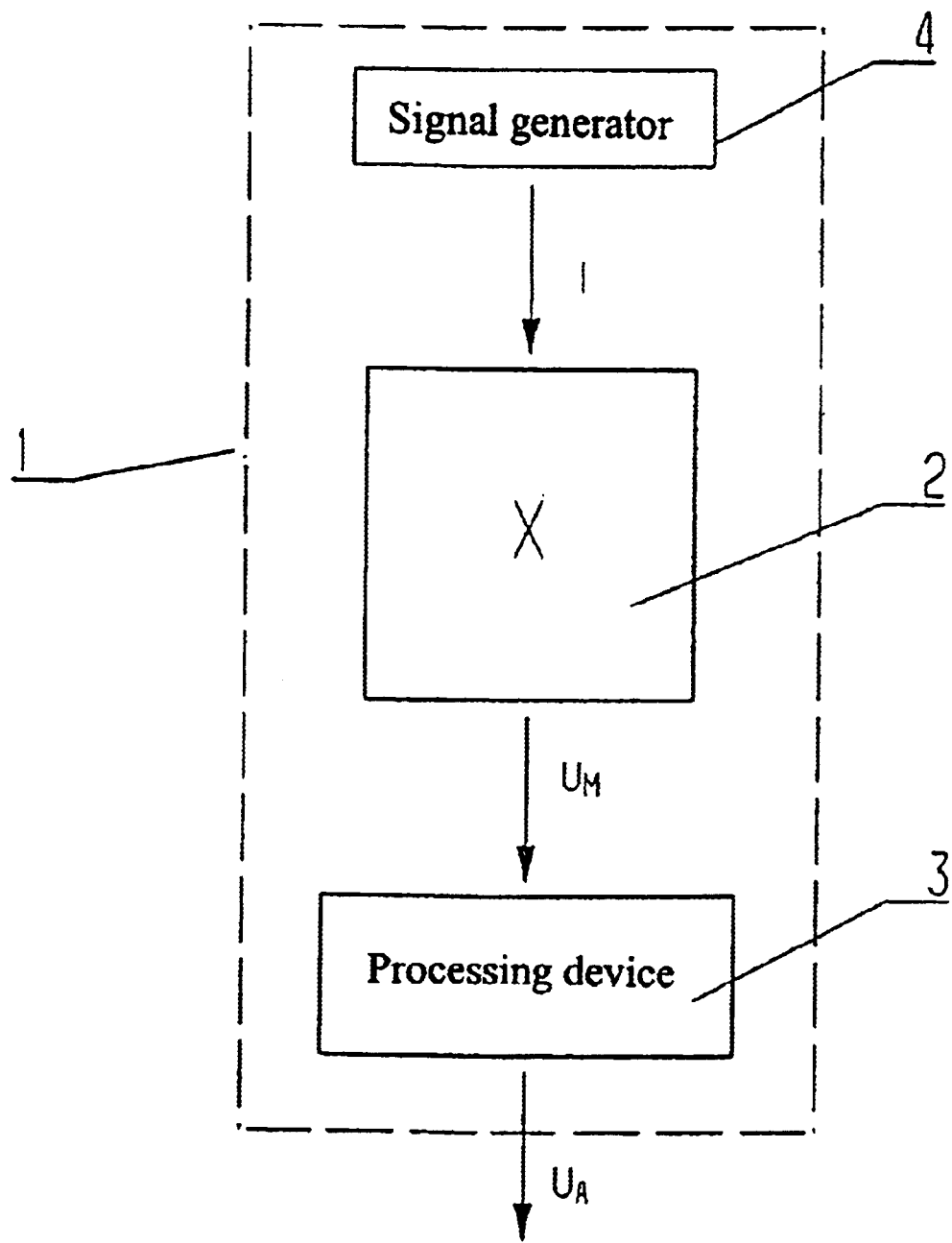
FIG. 1 is a block diagram of a Hall sensor component according to the present invention according to a first embodiment of the present invention.
Figure 2:
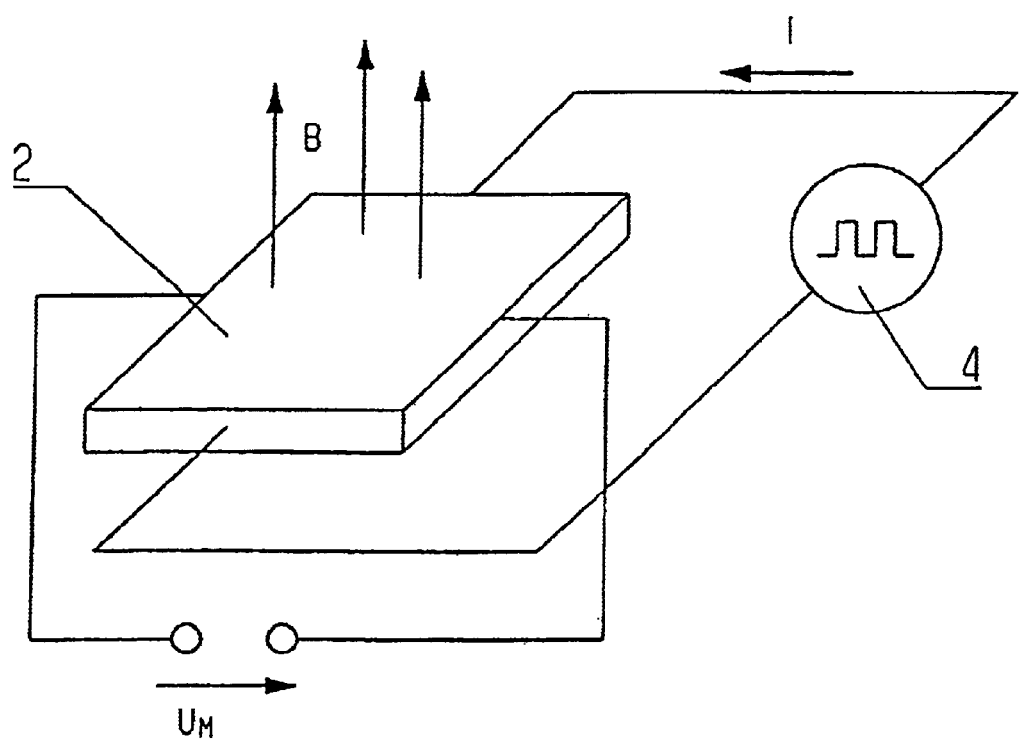
FIG. 2 is a schematic view of the Hall sensor and of the signal generator according to the first embodiment.

Referring to the drawings in particular, FIGS. 1 and 2 show a block diagram and a schematic view, respectively, of a Hall sensor component according to the present invention according to a first embodiment of the present invention. The Hall sensor component 1 has a Hall sensor 2 and a processing device 3, which are integrated in a housing, not shown. A signal generator 4, which is likewise integrated in the housing, generates a current 1, which flows through the Hall sensor 2. The Hall sensor 2 is exposed to a magnetic field, which is the cause for a Hall voltage, which is sent by the Hall sensor 2 and is proportional to the product of the current I and the magnetic flux density B of the magnetic field. The curve describing the current I generated by the signal generator 4 over time corresponds to a periodic square wave signal, whose characteristic shape is also reflected by the signal $U_M$ sent by the Hall sensor. A dual function is assigned to the current I here. On the one hand, the current I is used to operate the Hall sensor 2 and, on the other hand, it is used as a diagnosis signal based on its periodic characteristic. Consequently, the signal $U_M$ is a mixed signal, and the value of the magnetic flux density B is reflected by the amplitude of the mixed signal, and the frequency of the current I is reflected by the periodic component of this mixed signal. The mixed signal $U_M$ consequently has a diagnosis signal component and a Hall voltage component.

The mixed signal $U_M$ is sent to the processing device 3, which sends as an output signal a signal $U_A$, which is associated with and depends on the mixed signal $U_M$ and which likewise has a diagnosis signal component (diagnosis component) and a Hall voltage component (magnetic component).

The diagnosis component of the output signal $U_A$ is recognized and evaluated by an evaluating device, which is not shown and is arranged downstream of the processing device 3, so that it can be determined based on the evaluation whether the Hall sensor component is operating correctly at least with respect to the processing device.

Figure 3:
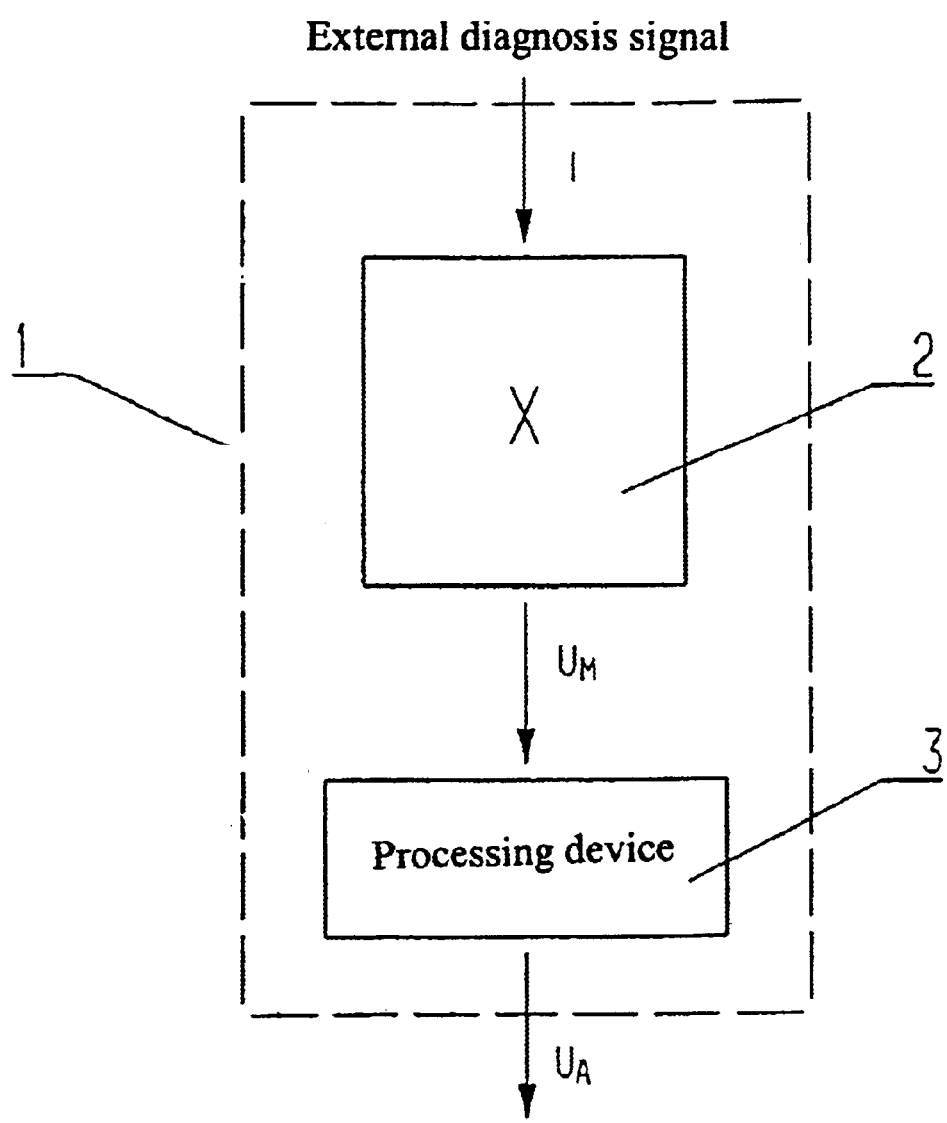
FIG. 3 is a block diagram of a Hall sensor component according to the present invention according to a second embodiment of the present invention.
Figure 4:
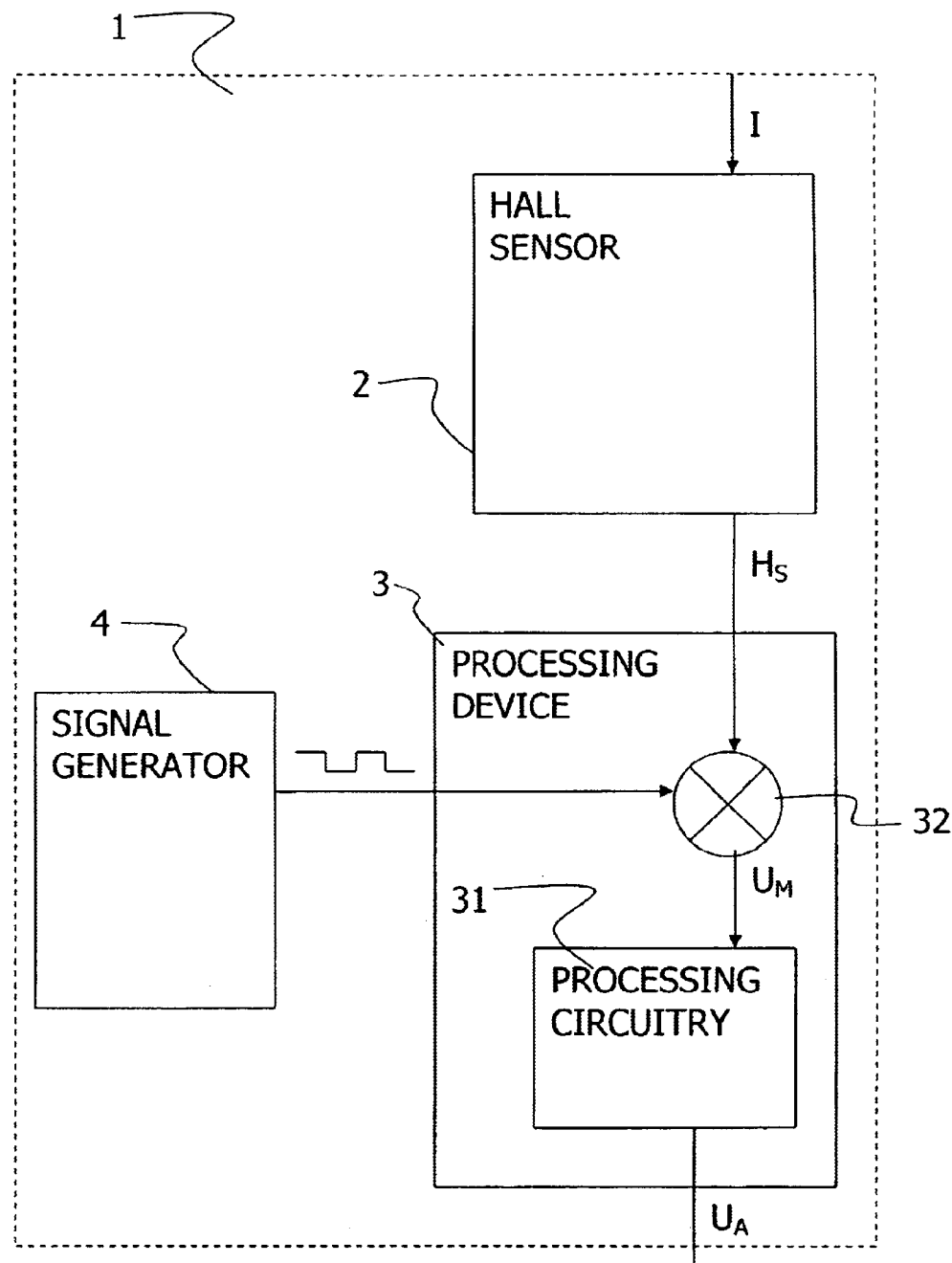
FIG. 4 is a block diagram of a Hall sensor component according to the present invention according to a third embodiment of the present invention.

FIG. 3 shows a block diagram of a Hall sensor component according to the present invention according to a second embodiment of the present invention, where the reference numbers used for the features according to the second embodiment are identical to the reference numbers used for the same or similar features according to the first embodiment.

The second embodiment is essentially identical to the first embodiment except for the integration of the signal generator 4 in the Hall sensor component. According to the second embodiment, the signal generator 4 is arranged, namely, outside the Hall sensor component, and the diagnosis signal generated by the signal generator is sent as an external diagnosis signal to the assembly unit formed by the Hall sensor 2 and the processing device 3.

According to a third embodiment, a linking of the Hall signal $H_S$ and the diagnosis square wave signal takes place behind the output of the Hall sensor Hall signal $H_S$. The processing device 3 has an analog adder 32 along with the processing circuitry 31. The adder 32 is used to mix the Hall signal $H_S$ and the diagnosis signal to form a mixed signal $U_M$. The mixed signal $U_M$ then forms the input signal of the processing circuitry 31 of the processing device 3.

While specific embodiments of the invention have been shown and described in detail to illustrate the application of the principles of the invention, it will be understood that the invention may be embodied otherwise without departing from such principles.

What is claimed is:

1. A Hall sensor component, comprising:
   a Hall sensor through which an electric current flows, said Hall sensor sending a Hall signal depending on a magnetic field acting on the Hall sensor and the electric current;
   a processing device arranged downstream of the said Hall sensor for processing an input signal, said processing device sending an output signal associated with the input signal; and
   a signal generator generating a diagnosis signal, said signal generator sending the diagnosis signal to an assembly unit formed by said Hall sensor and said processing device, wherein the Hall signal is linked with the diagnosis signal and is sent as the input signal to said processing device, wherein the Hall signal sent by said Hall sensor is directly linked with the diagnosis signal.

2. A Hall sensor component in accordance with claim 1, wherein the processing device includes an analog adder wherein the Hall signal is superimposed to the diagnosis signal by means of said analog adder.

3. A Hall sensor component in accordance with claim 1, wherein the diagnosis signal is a periodic square wave signal, which alternatingly assumes a logic high level and a logic low level.

4. A Hall sensor component in accordance with claim 1, wherein said signal generator is integrated within the Hall sensor component.

5. A Hall sensor component, comprising:
   a Hall sensor through which an electric current flows, said Hall sensor sending a Hall signal depending on a magnetic field acting on the Hall sensor and the electic current;
   a processing device arranged downstream of the said Hall sensor for processing an input signal, said processing device sending an output signal associated with the input signal; and
   a signal generator generating a diagnosis signal, said signal generator sending the diagnosis signal to an assembly unit formed by said Hall sensor and said processing device, wherein the Hall signal is linked with the diagnosis signal being sent as the input signal to said processing device, wherein the Hall signal is indirectly linked with the diagnosis signal by the electric current flowing through the Hall sensor being controlled as a function of the diagnosis signal.

6. A Hall sensor component in accordance with claim 5, wherein the electric current is switched on at a logic high level of the square wave signal and is switched off at a logic low level of the square wave signal.

7. A Hall sensor component, comprising:
   assembly unit comprising a Hall sensor and said processing device, a Hall sensor having an electric current input for providing a Hall sensor output signal depending on a magnetic field acting on the Hall sensor and depending on the electric current, said processing device being arranged for receiving an input signal including said Hall sensor output signal and processing the input signal to provide an output signal associated with the Hall sensor output signal, said processing device includes an analog adder; and
   a signal generator generating a diagnosis signal, said signal generator sending the diagnosis signal to said assembly unit as one of a control signal of said electric current input, to form a Hall sensor mixed output signal dependent on said diagnosis signal, and as a mixing signal to mix with said Hall sensor output signal to form a Hall sensor mixed output signal dependent on said diagnosis signal, said Hall sensor mixed output signal being provided as said processing device input signal, wherein the Hall sensor output signal sent by said Hall sensor is directly linked with the diagnosis signal to form said Hall sensor mixed output signal by superimposing the Hall sensor output signal on the diagnosis signal by means of said analog adder.

8. A Hall sensor component in accordance with claim 7, wherein the diagnosis signal is a periodic square wave signal, which alternatingly assumes a logic high level and a logic low level.

9. A Hall sensor component in accordance with claim 8, wherein the electric current is switched on at a logic high level of the square wave signal and is switched off at a logic low level of the square wave signal.

10. A Hall sensor component in accordance with claim 7, wherein said signal generator is integrated within the Hall sensor component.

11. A hall sensor component, comprising:
    assembly unit comprising a Hall sensor and said processing device, a Hall sensor having an electric current input for providing a Hall sensor output signal depending on a magnetic field acting on the Hall sensor and depending on the electric current, said processing device being arranged for receiving an input signal including said Hall sensor output signal and processing the input signal to provide an output signal associated with the Hall sensor output signal; and
    a signal generator generating a diagnosis signal, said signal generator sending the diagnosis signal to said assembly unit as one of a control signal of said electric current input, to form a Hall sensor mixed output signal dependant on said diagnosis signal, and as a mixing signal to mix with said Hall sensor output signal to form a Hall sensor mixed output signal dependant on said diagnosis signal, said Hall sensor mixed output signal being provided as said processing device input signal, wherein the Hall signal is indirectly linked with the diagnosis signal by the electric current flowing through the Hall sensor being controlled as a function of the diagnosis signal.

12. A Hall sensor component, comprising:
    a Hall sensor through which an electric current flows, said Hall sensor providing an output of a Hall signal depending on a magnetic field acting on the Hall sensor and the electric current;

a processing device arranged downstream of the said Hall sensor for processing an input signal, said processing device sending an output signal associated with the input signal; and a signal generator generating a diagnosis signal, said signal generator sending the diagnosis signal to an assembly unit formed by said Hall sensor and said processing device, wherein the Hall signal is linked with the diagnosis signal and is sent with the diagnosis signal as the input signal to said processing device and the Hall signal sent by said Hall sensor is directly linked with the diagnosis signal downstream of or behind the output of the hall sensor.

13. A hall sensor component, comprising:

a Hall sensor through which an electric current flows, said Hall sensor providing a Hall sensor output signal depending on a magnetic field acting on the Hall sensor and the electric current;

a processing device arranged downstream of the Hall sensor output for processing an input signal, said processing device sending a processing device output signal associated with the input signal; and a signal generator generating a diagnosis signal having a frequency changed as a function of the Hall sensor output signal, said signal generator sending the diagnosis signal to an assembly unit formed by said Hall sensor and said processing device, wherein the Hall sensor output signal is indirectly or directly linked with the diagnosis signal, the Hall sensor output signal linked with the diagnosis signal being sent as the input signal to said processing device.

* * * * *